United States Patent [19]
Dickinson et al.

[11] Patent Number: 5,309,395
[45] Date of Patent: May 3, 1994

[54] SYNCHRONOUS STATIC RANDOM ACCESS MEMORY

[75] Inventors: Alexander G. Dickinson, Highlands; Mehdi Hatamian, Freehold; Sailesh K. Rao, Lakewood, all of N.J.

[73] Assignee: AT&T Bell Laboratories, Murray Hill, N.J.

[21] Appl. No.: 965,127

[22] Filed: Oct. 22, 1992

[51] Int. Cl.[5] ............................................. G11C 7/00
[52] U.S. Cl. ..................... 365/189.04; 365/189.05; 365/203; 365/233; 365/189.07
[58] Field of Search ............... 365/189.05, 230.08, 365/189.04, 203, 189.07, 233

[56] References Cited

U.S. PATENT DOCUMENTS

| | | | |
|---|---|---|---|
| 4,829,471 | 5/1989 | Banerjee et al. | 365/189.05 X |
| 4,849,937 | 7/1989 | Yoshimoto | 365/189.05 |

OTHER PUBLICATIONS

Chu, S. T. et al., "A 25-ns Low-Power Full-CMOS 1-Mbit (128K×8) SRAM," IEEE Journal of Solid-State Circuits, vol. 23, No. 5, Oct. 1988, pp. 1078-1084.
deWerdt, R. et al., "A 1M SRAM With Full CMOS Cells Fabricated In A 0.7$ mu $M Technology," IEDM, 1987, pp. 532-534.
Nakagome, Y. et al., "A 1.5V Circuit Technology for 64 Mb DRAMs," 1990 Symposium on VLSI Circuits, Honolulu, Jun. 7-9, 1990, pp. 17-18.
Blalock, T. N. et al., "An Experimental 2T Cell RAM With 7 NS Access Time At Low Temperatures," 1990 Symposium on VLSI Circuits, Honolulu, Jun. 7-9, 1990, pp. 13-14.
Sasaki, K. et al., "A 9-ns 1-Mbit CMOS SRAM," IEEE Journal of Solid-State Circuits, vol. 24, No. 5, Oct. 1989, pp. 1219-1225.
Seevinck, E., "A Current Sense-Amplifier For Fast CHMO SRAMs," 1990 Symposium on VLSI Circuits, Honolulu, Jun. 7-9, 1990, pp. 43-44.
Seevinck, E. et al., "Current-Mode Techniques for High-Speed VLSI Circuits With Application To Current Sense Amplifier for CMOS SRAM's," IEEE Journal of Solid-State Circuits, vol. 26, No. 4, Apr. 1991, pp. 525-536.

Primary Examiner—Eugene R. LaRoche
Assistant Examiner—Do Hyum Yoo
Attorney, Agent, or Firm—Gerard A. deBlasi

[57] ABSTRACT

Maximum operating speed is achieved in an array of memory cells by performing both read and write operations within a single memory cycle. As outgoing data are read from the memory cells, incoming data are stored immediately in those cells. Once data are read from the memory cells, a latch signal is generated to trigger latching of the read data for output to a data bus. The same latch signal that is used to latch the read data initiates the writing of new data to the memory cells. Use of a single latch signal in this manner ensures that new data are not written to the memory cells until the existing data has been read from those cells.

14 Claims, 4 Drawing Sheets

SYNCHRONOUS STATIC RANDOM ACCESS MEMORY

TECHNICAL FIELD

This invention relates to memory circuits and, more particularly, to static random access memory circuits.

BACKGROUND OF THE INVENTION

In certain applications for which memory is required, new data to be written to the cells of a memory array are available before existing data is read from those cells. For example, when buffering packets of data during asynchronous transfer mode (ATM) switching, new data packets are presented to memory at the same time as existing packets can be read from memory. In such applications, it would be desirable to read the existing data and write the new data to the memory cells within a single memory cycle, so as to achieve maximum performance for a selected clock speed.

Conventional memory circuits, however, provide less than optimum performance. Conventional memory circuits require at least two memory cycles to perform both the read and write functions—existing data are read from memory during a first memory cycle, and new data are written to the memory in a subsequent memory cycle. To increase the operating speed of a conventional memory, a higher clock speed is required. Such a faster memory would consume more power and provide smaller storage capacity, and typically may necessitate fabricating the memory using a more complex and expensive technology.

SUMMARY OF THE INVENTION

Maximum operating speed is achieved in a static random access memory by performing both read and write operations within a single memory cycle. As outgoing data are read from the cells of the random access memory, incoming data are stored immediately in those cells. Once data are read from the memory cells, a latch signal is generated to trigger latching of the read data for output to a data bus. The same latch signal that is used to latch the read data initiates the writing of new data to the memory cells. Use of a single latch signal in this manner ensures that new data are not written to the memory cells until the existing data has been read from the cells. Performance is increased by a factor of two over a conventional design with the same clock rate.

In an exemplary embodiment of the invention, a sense amplifier is coupled to a pair of bit lines from a memory cell to be read. The sense amplifier reads the existing data from the memory cell by determining which of the bit lines has a higher voltage. Once the sense amplifier has determined the value of the memory cell datum, a latch signal is generated, in response to the output of the sense amplifier. The latch signal triggers latching of the datum by a read latch and simultaneously triggers the start of a write operation by a write circuit. The read latch outputs the latched data to a data bus. The write circuit then writes new data to the memory cell.

DETAILED DESCRIPTION

Figure 1:
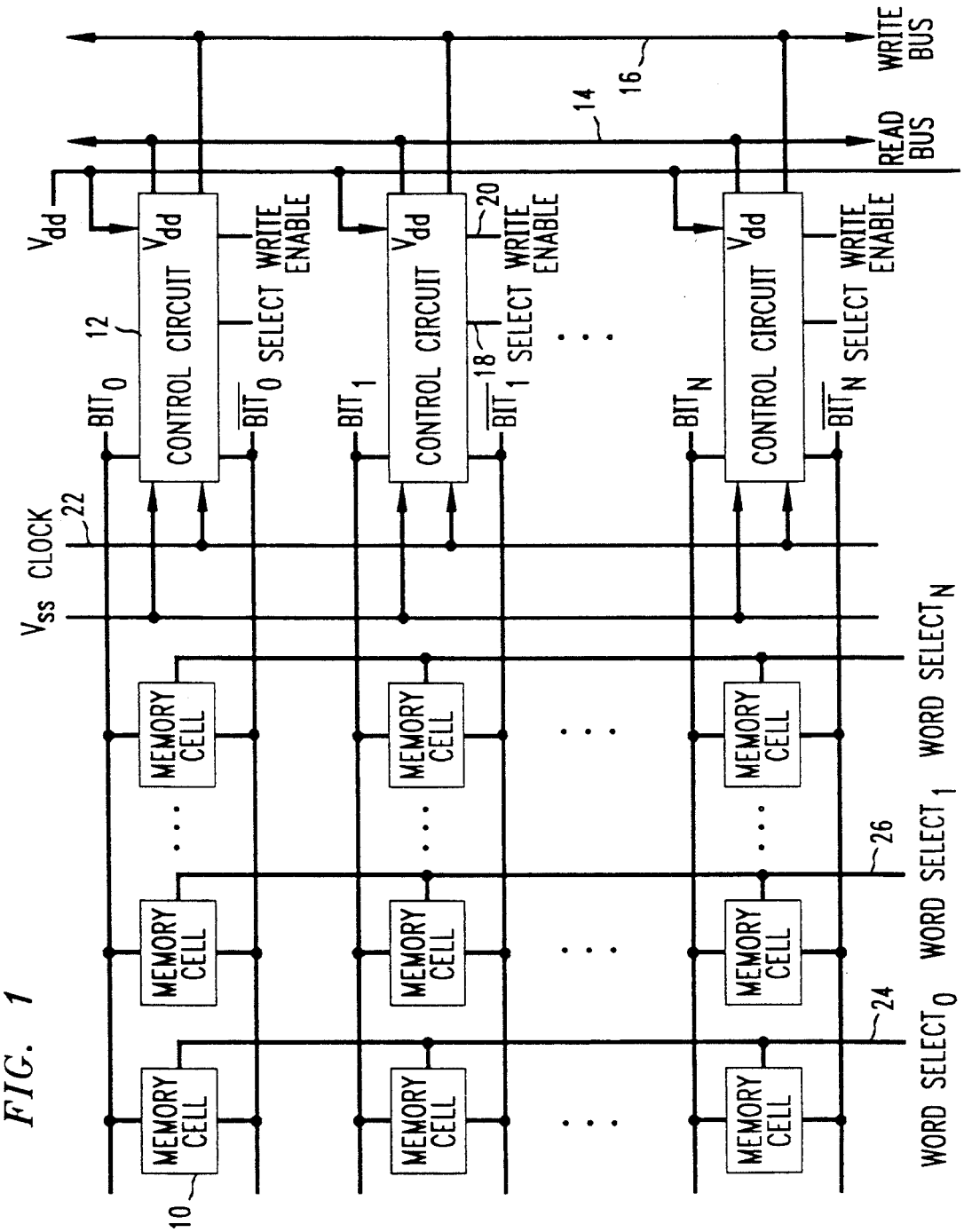
FIG. 1 is a simplified block diagram of an array of memory cells and a control circuit constructed in accordance with the principles of the present invention.

FIG. 1 shows an array of memory cells arranged in a conventional manner. The array of memory cells is arranged in a matrix having n horizontal rows and n vertical columns. The memory cells 10 in a given column are coupled by a word select line. During each memory cycle, a single word select line is energized to specify the group of memory cells active during that memory cycle. The memory cells within each row are coupled to each other by two bit lines, BIT and $\overline{\text{BIT}}$.

Each memory cell 10 has two nodes. One of the two nodes stores an actual data value and is coupled to the bit line "BIT." The other of the two nodes stores the complement of the data value stored by the first node. This second node is coupled to the bit line "$\overline{\text{BIT}}$."

In accordance with the invention, each row of memory cells is coupled via its respective bit lines to a control circuit 12. Control circuit 12 reads data from and writes data to a selected memory cell, as specified by the word select line (e.g., lines 24 and 26), within the row. Control circuit 12 outputs data read from the memory cells to a read bus 14 and receives data to be written to the memory cells from a write bus 16. A "select" control line 18 is provided to control circuit 12 to enable read and write operations to be performed on groups or subsets of the memory cells that are coupled to the energized word select line.

Power for control circuit 12 is provided from $V_{dd}$. Control circuit 12, in turn, powers the memory cells via the bit lines. The memory array operates synchronously, in response to system clock signals input to control circuit 12 via line 22.

In an exemplary embodiment of the invention, the memory of the invention is utilized within a telecommunications packet switch, such as an ATM switch. The memory of the present invention is used to read and write, within a single memory cycle, entire packets of data to selected groups of memory cells. The telecommunications switch generates an address that is decoded by a decoder (not shown), using conventional memory addressing techniques, to uniquely identify a group of memory cells 10 that will store a packet of data, with each bit of the data packet being stored in a different one of the memory cells. A decoded address typically will correspond to several memory cells that are coupled by a common word select line, such as line 24.

Figure 2:
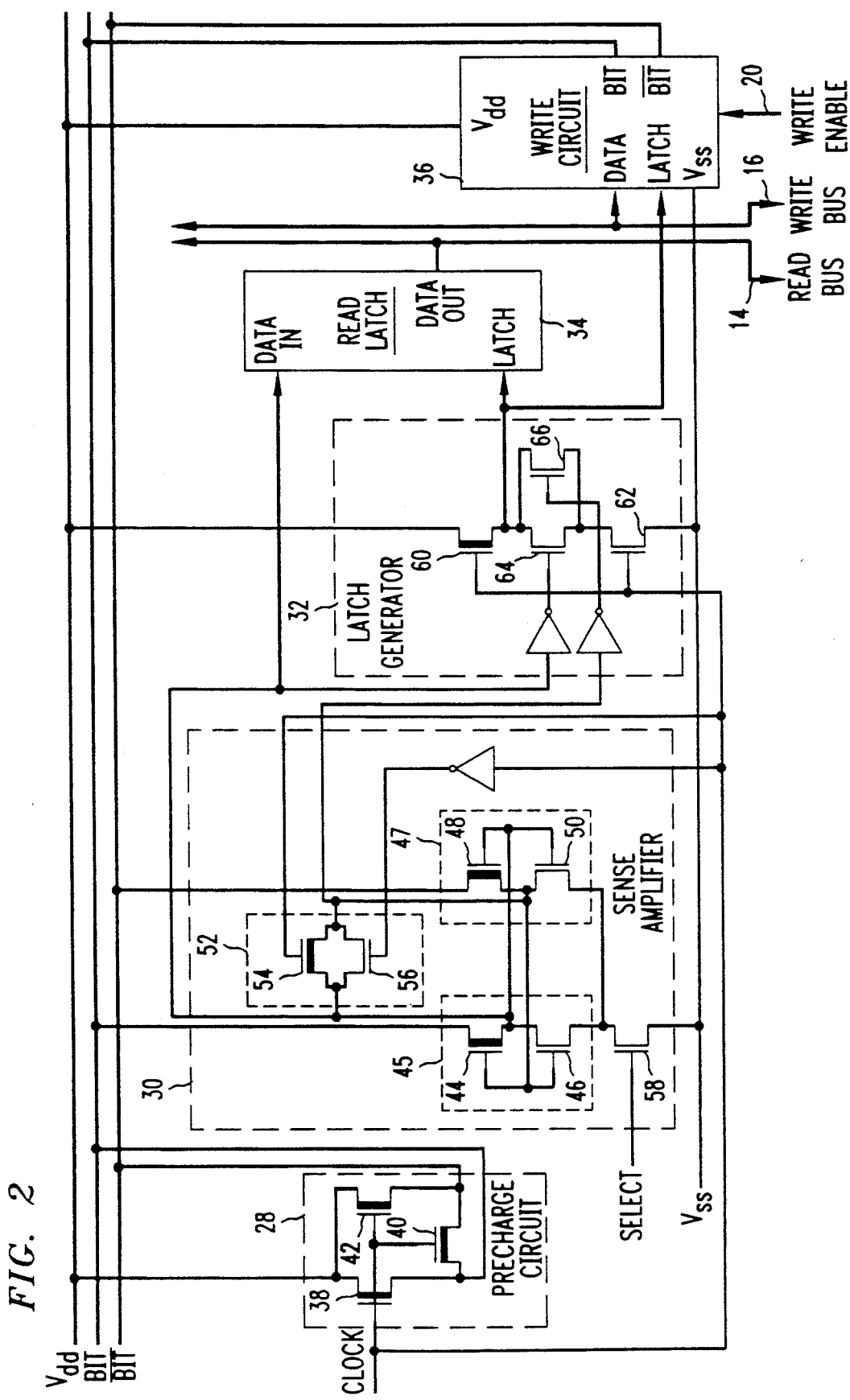
FIG. 2 is a partial schematic diagram of the control circuit of FIG. 1.

FIG. 2 shows control circuit 12 in greater detail. Control circuit 12 includes a precharge circuit 28, a sense amplifier 30, a latch generator circuit 32, a read latch circuit 34, and a write circuit 36, each of which is described in greater detail below. Generally, however, control circuit 12 operates as follows. Precharge circuit 28 precharges the bit lines to $V_{dd}$ in the first half of the memory cycle. In the second half of the memory cycle, sense amplifier 30 detects changes in the voltages on the bit lines, so as to read the data value from the memory cell. When the read is complete, latch generator circuit 32 generates a latch signal and outputs the latch signal simultaneously to read latch circuit 34 to latch the data and to write circuit 36 to initiate a write operation.

More particularly, sense amplifier 30 is coupled to the bit lines to detect changes in the voltages on those bit lines. In response to changes in the bit line voltages, sense amplifier 30 determines which of the bit lines is coupled to a logic one and which is coupled to a logic zero. Upon reaching a decision, sense amplifier 30 outputs the data simultaneously to latch generator 32 and read latch 34. Latch generator 32 generates a latch signal in response to the output signal from amplifier 30 upon receipt of a system clock signal. The latch signal from latch generator 32 is provided simultaneously to read latch 34 and to write circuit 36. Read latch 34 latches the signal from sense amplifier 30 upon receiving a latch signal from latch generator 32. Read latch 34 outputs the latched data to read bus 14. Write circuit 36 receives incoming data to be written to a memory cell from write bus 16. Write circuit 36 initiates the write operation upon receiving the latch signal from latch generator 32 if the write enable line is energized. As will be described below, it is the provision of a common latch signal to read latch 34 and write circuit 36 that enables control circuit 12 to perform both a read and write operation on a memory cell within a single clock cycle.

Precharge circuit 28 includes enhancement-type P-channel transistors 38, 40, and 42. The gate terminal of transistors 38, 40, and 42 are connected to the clock signal. The drain of transistors 38 and 42 are connected to $V_{dd}$. The source of transistors 38 and 42 are coupled together through transistor 40. The source terminal of transistor 38 is coupled to one bit line (e.g. BIT) and the source terminal of transistor 42 is coupled to the other bit line (e.g. $\overline{BIT}$). Of course, it will be apparent to one skilled in the art that precharge circuit 28 could be any circuit which quickly charges the bit lines to $V_{dd}$ upon receipt of a clock signal.

Figure 3:
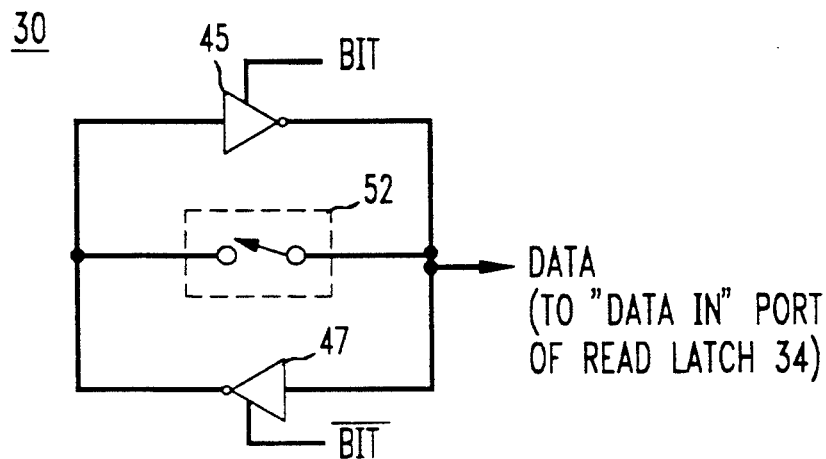
FIG. 3 is a simplified schematic diagram of an illustrative embodiment of the sense amplifier of FIG. 2.

As described above, sense amplifier 30 detects relative changes in the voltages on the bit lines to determine which of the bit lines is connected to a logic one and which is connected to a logic zero, so as to read data from a memory cell 10. In an illustrative embodiment of the invention, sense amplifier 30, shown in simplified form in FIG. 3, includes two inverters 45 and 47 that are regeneratively cross-coupled through a balance circuit 52 (shown in greater detail in FIG. 2). As discussed further below, when balance circuit 52 is closed, inverters 45 and 47 remain in an unstable state. Once balance circuit 52 opens, the inverters drive to a stable state in a direction that is determined by the relative voltages on the bit lines. The direction of current flow between the inverters, as determined by the relative voltages on the bit lines, establishes the value of the data to be latched by read latch 34.

Inverters 45 and 47 are formed by complimentary-symmetry MOS (CMOS) transistors 44 and 46, and transistors 48 and 50, respectively. The gates of transistors 44 and 46 are regeneratively coupled to the gates of transistors 48 and 50 through balance circuit 52, comprising transistors 54 and 56. The gate terminals of transistors 54 and 56 are controlled by the system clock signal. Balance circuit 52 appears to inverters 45 and 47 as a short circuit when the clock signal is low. Conversely, balance circuit 52 appears to inverters 45 and 47 as a open circuit when the clock signal is high.

Inverters 45 and 47 draw power for circuit operation from the bit lines. This provides an advantage over conventional sense amplifiers, which drew current from supply lines (e.g., $V_{dd}$), because the sense amplifier of the present invention draws negligible current once it has read the contents of a memory cell.

The embodiment of sense amplifier 30 described above offers several other advantages over conventional sense amplifier designs. For example, sense amplifier 30 discharges the bit lines only slightly during a read operation, leaving the bit lines at a voltage near $V_{dd}$. This facilitates fast precharging of the bit lines after the sensing operation is completed. Also, sense amplifier 30 is most sensitive around $V_{dd}$. This simplifies precharging of the bit lines, because $V_{dd}$ is readily available. In contrast, conventional sense amplifier circuits are most sensitive to voltages around $V_{dd}/2$. Thus, conventional sense amplifiers required additional circuitry, and thus a more complex circuit design, to generate $V_{dd}/2$. Furthermore, the sense amplifier of the present invention is comprised of only a single stage, the output of which is a true CMOS voltage. Conventional sense amplifier designs require one or more additional stages, following the sensing stage, to restore output voltages to true CMOS voltages. These additional stages increase manufacturing costs, reduce operating speed, and require additional wafer space.

Sense amplifier 30 operates as follows. The amplifier is first selected by applying an appropriate voltage to select line 18 to establish a current path between inverters 45 and 47 and $V_{ss}$ through transistor 58. The voltage on the bit lines causes cross-coupled inverters 45 and 47 to remain in an unstable state as long as the cross-connect formed by balance circuit 52 remains in a short circuit state. Upon receipt of a clock signal, balance circuit 52 appears to inverters 45 and 47 as an open circuit, causing the inverters to drive to a stable state in response to the difference in voltage between the bit lines. When the voltage on line BIT is higher than the voltage on line $\overline{BIT}$, inverters 45 and 47 will drive the output of inverter 45 high, causing a logic one to be output to the "Data In" terminal of read latch 34. However, when the voltage on $\overline{BIT}$ is higher than the voltage on BIT, inverters 45 and 47 will drive the output of inverter 45 low, causing a logic zero to be output to the Data In terminal of read latch 34.

Latch generator circuit 32 causes the control circuit to operate in a synchronous mode by generating a clocked latch signal from the system clock. Latch generator circuit 32 includes transistors 60, 62, 64, and 66. Latch generator circuit 32 receives the data signals output from sense amplifier 30, together with a system clock signal, and uses these three signals to generate a latch signal. The output of sense amplifier 30, comprising the signal read from the memory cell and its inverse, are input to transistors 64 and 66. The drain terminals of 64 and 66 are coupled to $V_{dd}$ through the source terminal of transistor 60. The source terminals of transistors 64 and 66 are connected to $V_{ss}$ through transistor 62. Transistors 60 and 62 are controlled by the clock signal. Upon receipt of a clock signal, transistors 60 and 62 cause current to flow from $V_{dd}$ to $V_{ss}$ when data are presented to latch generator circuit 32, from sense amplifier 30, on transistors 64 and 66. This generates a latch signal at the source terminal of transistor 60. The latch signal is simultaneously provided to read latch 34 and write circuit 36.

Read latch 34 receives at its Data In terminal the value of the existing contents of the memory cell (i.e., the value on the line BIT). This value is latched upon receipt by the read latch of the latch signal from latch generator circuit 32. Read latch 34 outputs the latched value to read bus 14. Read latch 34 can be any suitable circuit, such as a D-type flipflop.

Write circuit 36 receives new data to be written to the memory cell via write bus 16. The data on write bus 16 is presented to write circuit 36 prior to the write circuit receiving the latch signal from latch generator 32. Upon receipt of the latch signal, write circuit 36 causes one of the bit lines to be drawn to ground, so as to write the new data to the memory cell. Write circuit 36 operates only when write enable line 20 is energized. It will be apparent to one skilled in the art in view of this disclosure that write circuit 36 can be constructed using any suitable circuitry.

Figure 4:
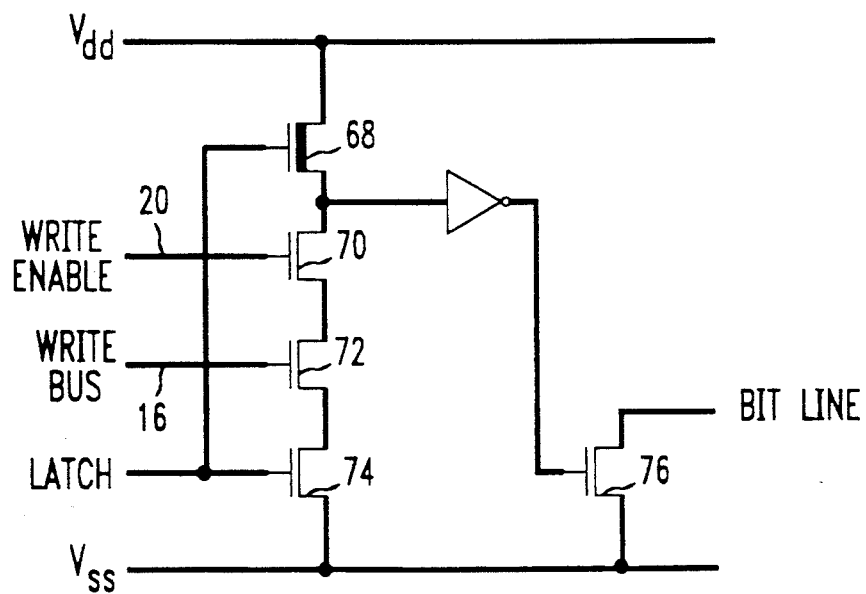
FIG. 4 is a schematic diagram of the write circuit of FIG. 2.

FIG. 4 shows an exemplary embodiment of a circuit 67 within write circuit 36 for writing to one of the pair of bit lines (i.e., BIT or $\overline{BIT}$). A corresponding duplicate circuit is provided within write circuit 36 for the other bit line (the signal on the data line is inverted). Circuit 67 includes transistors 68, 70, 72, 74, and 76. Transistors 68, 70, 72, and 74 provide a current path between $V_{dd}$ and $V_{ss}$. Transistors 68 and 74 are controlled by the latch signal from latch generator 32, while transistors 70 and 72 are controlled by write enable line 20 and data received from write bus 16, respectively. Transistor 76 is turned on, driving the bit line to $V_{ss}$, when the data on write bus 16 is set high and a write is selected simultaneously on write enable line 20. Under these circumstances, the latch signal clocks circuit 67, and a write is performed.

Having described the structure of the synchronous static random access memory of the present invention, the operation of the memory will now be described with reference to FIG. 5.

Figure 5:
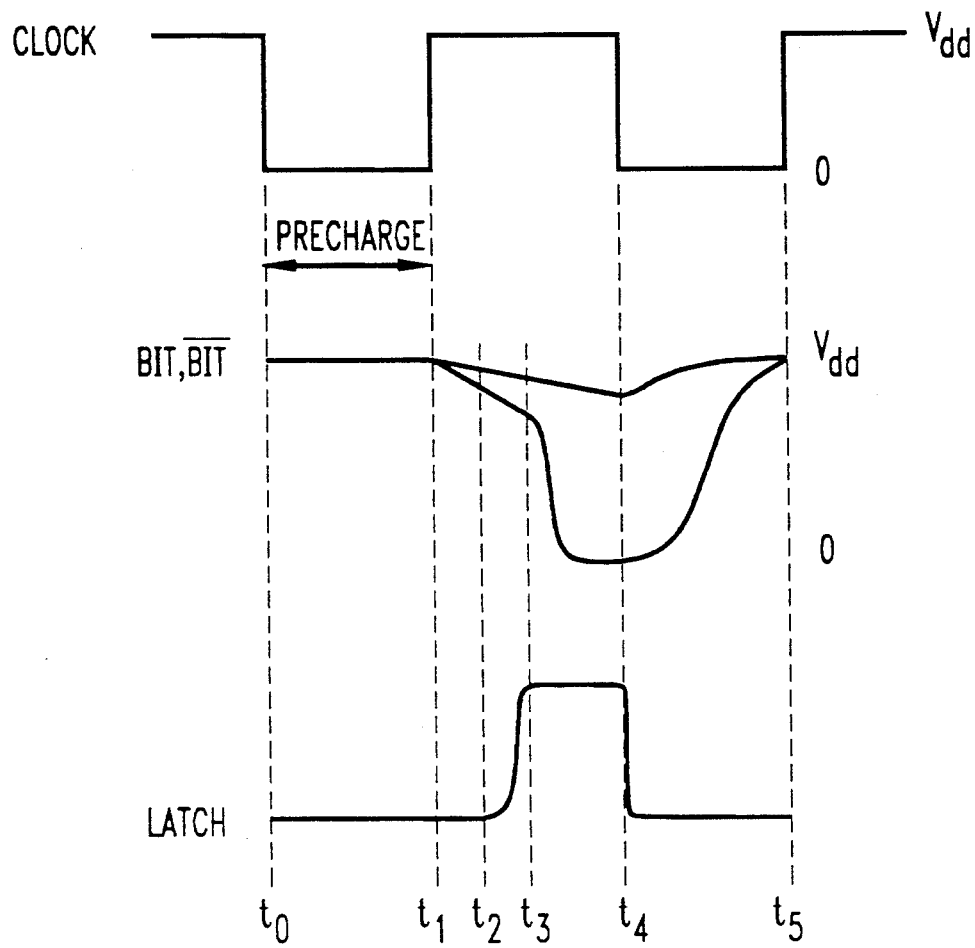
FIG. 5 is a timing diagram of the memory cycle of the memory circuit of FIG. 1.

FIG. 5 illustrates the timing of various signals within the memory of the present invention. During a first time interval, $t_0$-$t_1$, the clock signal goes low. The low clock signal actuates precharge circuit 28 and closes balance switch 52 by turning on transistors 54 and 56 of sense amplifier 30. Precharge circuit 28 charges the bit lines to a voltage of $V_{dd}$, providing power to sense amplifier circuit 30. (For simplicity, the bit lines are depicted in interval $t_0$-$t_1$ as already being in their precharged state.) The latch signal is low. Select line 18 is driven high to select the control circuits 12 required for this memory cycle.

During the interval $t_1$-$t_2$, the clock signal goes high, terminating the precharge of the bit lines. At the same time, a word select line (shown in FIG. 1) is driven high, causing one memory cell from each row of the array to be connected to a different one of control circuits 12 by a respective pair of bit lines. Because the bit lines provide power to sense amplifier 30, the voltage of both bit lines will drop slightly from $V_{dd}$. However, the memory cell will cause the voltage of one of the bit lines to drop faster than the other. This occurs because one node of the memory cell stores a zero, and thus is connected to ground.

During the interval $t_2$-$t_3$, balance switch 52 is opened, causing inverters 45 and 47 of sense amplifier 30 to drive to a stable state. A short delay is provided prior to opening balance switch 52 so as to permit the voltages on the bit lines to sufficiently separate from each other (during interval $t_1$-$t_2$) to facilitate the sensing operation. At time $t_3$, the sensing operation is completed and the latch signal is generated. The data value output by sense amplifier 30 is latched in read latch 34 and the write operation is initiated.

During the interval $t_3$-$t_4$, one of the bit lines is pulled to ground, causing a zero to be written to the memory cell node associated with that bit line. The other bit line remains charged to a voltage near $V_{dd}$, causing a one to be written to the memory cell node associated with the second bit line. The write operation is complete at $t_4$.

During the interval $t_4$-$t_5$, a new memory cycle begins. The clock signal again goes low to initiate the precharge phase. Both bit lines are charged to $V_{dd}$. The latch signal returns to zero. Sense amplifier 30 is again ready to read the contents of the memory cell.

In accordance with another feature of the invention, the power consumed by the memory of the present invention can be greatly reduced by preventing the occurrence of a write operation if the value of a bit to be written to a memory cell is the same as the value of the bit currently stored in that memory cell. As discussed previously, the content of a selected cell is read immediately prior to writing new data to the cell. Thus, the result of a read operation on a particular memory cell can be compared with the data to be written to that cell to determine whether a subsequent write operation is required. If the value in the cell equals the value to be written, the write operation is blocked.

Figure 6:
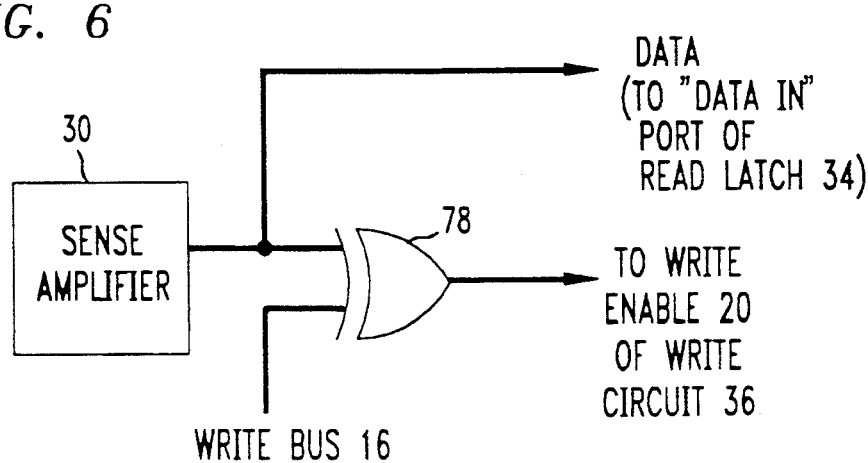
FIG. 6 is a partial schematic diagram of an illustrative circuit for comparing the value of new data to be written to memory with data existing in memory and controlling the write operation in response to the comparison.

FIG. 6 shows exemplary circuitry for implementing a comparison of the contents of a memory cell following a read operation and data to be written to the cell. The circuit includes an exclusive-OR gate 78, one input terminal of which is coupled to the "data" output of sense amplifier 30. The other input terminal of exclusive-OR gate 78 is coupled to write bus 16. The output terminal of exclusive-OR gate 78 drives write enable 20 of write circuit 36 to enable or disable the write circuit. When the data value output from sense amplifier 30 is the same as the value presented on write bus 16, exclusive-OR gate 78 outputs a logic zero to write circuit 36 and thus prevents a write operation. Conversely, when the data value output from sense amplifier 30 is the different from the value presented on write bus 16, exclusive-OR gate 78 outputs a logic one to write circuit 36 and thus enables a write operation.

It will be understood that the foregoing is merely illustrative of the principles of the invention, and that various modifications can be made by those skilled in the art without departing from the scope and spirit of the invention. For example, the read/write memory and control circuit of the invention is suitable for use in a "write back cache," for performing simultaneous read and write operations. The memory of the present invention reads existing data from the cache and writes the data from the cache back to main memory. At the same time new data is written from main memory to the cache.

We claim:

1. A synchronous static random access memory capable of reading from and writing to a memory cell of said memory in a single memory access cycle, said memory comprising:

means disposed at each memory cell for receiving a signal indicative of the value of a bit to be written to said memory cell;

sensing means connected to bit lines associated with said memory cell for generating a sensed output indicative of the value of the bit stored at said memory cell;

a latch generator responsive to the generation of said sensed output for generating a latch signal; and means responsive to said latch signal for concurrently latching said bit value into a data storing means and initiating the writing of an input bit value into said memory cell.

2. The memory of claim 1 wherein said sensing means is arranged so that it is effectively disconnected from said bit lines no later than the time that said latch signal is generated.

3. The memory of claim 1 wherein said sensing means includes a sense amplifier comprising a pair of inverters having respective source-to-drain current paths and respective control nodes, means for regeneratively cross-coupling said control nodes and said current paths, and means for connecting each of said bit lines into a respective one of said current paths.

4. The memory of claim 3 wherein said sensing means further includes means for precharging said bit lines to a common potential, whereby said sense amplifier thereafter senses a voltage difference between the signals on said bit lines responsive to changes in at least one of said signals caused by the value of the bit stored at said memory cell.

5. The memory of claim 1 wherein the sensing means generates the sensed output in response to the receipt of a clock signal.

6. The memory of claim 1 further comprising means for preventing the writing of said input bit into the memory cell if said bit value and the value of the input bit are equal.

7. A circuit for reading from and writing to a selected memory cell of a random access memory, said circuit being capable of reading from and writing to the selected memory cell in a single memory access cycle, said circuit comprising:

means for receiving a signal indicative of the value of a bit to be written to said memory cell;

sensing means connected to bit lines associated with said memory cell for generating a sensed output indicative of the value of the bit stored at said memory cell;

a latch generator responsive to the generation of said sensed output for generating a latch signal; and means responsive to said latch signal for concurrently latching said bit value into a data storing means and initiating the writing of an input bit value into said memory cell.

8. The circuit of claim 7 wherein said sensing means is arranged so that it is effectively disconnected from said bit lines no later than the time that said latch signal is generated.

9. The circuit of claim 7 wherein said sensing means includes a sense amplifier comprising a pair of inverters having respective source-to-drain current paths and respective control nodes, means for regeneratively cross-coupling said control nodes and said current paths, and means for connecting each of said bit lines into a respective one of said current paths.

10. The circuit of claim 9 wherein said sensing means further includes means for precharging said bit lines to a common potential, whereby said sense amplifier thereafter senses a voltage difference between of the signals on said bit lines responsive to changes in at least one of said signals caused by the value of the bit stored at said memory cell.

11. The circuit of claim 7 wherein the sensing means generates the sensed output in response to the receipt of a clock signal.

12. The circuit of claim 7 wherein the memory cell is a cell in a cache memory.

13. The circuit of claim 7 further comprising means for preventing the writing of said input bit into the memory cell if said bit value and the value of the input bit are equal.

14. A method for use in a telecommunications packet switch in which a packet of data, comprising a plurality of bits, is stored in a plurality of memory cells that are identified by an address, each memory cell storing a different one of the plurality of bits, the method comprising the steps of:

generating the address identifying the plurality of memory cells that will store a first packet of data;

receiving at each memory cell a signal indicative of the value of a bit of the first packet of data to be written to said memory cell;

generating at each memory cell a sensed output indicative of the value of the bit of a second packet of data stored at said memory cell;

at each memory cell, upon generation of said sensed output, concurrently latching said bit value of the first packet into a data storing means and initiating the writing of an input bit value into said memory cell, such that the first packet of data is stored at the address and the second packet of data is read from the address within a single memory cycle.

* * * * *